(12) United States Patent
Cern (10) Patent No.: US 9,612,271 B2
(45) Date of Patent: Apr. 4, 2017

(54) EVALUATING NOISE AND EXCESS CURRENT ON A POWER LINE

(75) Inventor: Yehuda Cern, Efrat (IL)

(73) Assignee: ERICSSON INC., Plano, TX (US)

( * ) Notice: Subject to any disclaimer, the term of this patent is extended or adjusted under 35 U.S.C. 154(b) by 1247 days.

(21) Appl. No.: 13/582,941

(22) PCT Filed: Mar. 4, 2011

(86) PCT No.: PCT/US2011/027116
§ 371 (c)(1),
(2), (4) Date: Sep. 6, 2012

(87) PCT Pub. No.: WO2011/109674
PCT Pub. Date: Sep. 9, 2011

(65) Prior Publication Data
US 2013/0006560 A1    Jan. 3, 2013

Related U.S. Application Data

(60) Provisional application No. 61/310,933, filed on Mar. 5, 2010.

(51) Int. Cl.
G01R 31/08 (2006.01)
G01R 31/02 (2006.01)
G06F 19/00 (2011.01)
G01R 31/12 (2006.01)

(52) U.S. Cl.
CPC ....... *G01R 31/1272* (2013.01); *G01R 31/083* (2013.01)

(58) Field of Classification Search
None
See application file for complete search history.

(56) References Cited

U.S. PATENT DOCUMENTS

| | | | |
|---|---|---|---|
| 5,530,364 | A | 6/1996 | Mashikian et al. |
| 5,642,038 | A | 6/1997 | Kim et al. |
| 6,809,523 | B1 | 10/2004 | Ahmed et al. |
| 7,183,774 | B2 | 2/2007 | Kuppuswamy |
| 7,418,240 | B2 | 8/2008 | Hsu et al. |
| 7,532,012 | B2 | 5/2009 | Cern |
| 7,579,843 | B2 | 8/2009 | Younsi et al. |
| 7,863,905 | B2 | 1/2011 | Cern |
| 2006/0132144 | A1 | 6/2006 | Kato et al. |

(Continued)

FOREIGN PATENT DOCUMENTS

| | | |
|---|---|---|
| CN | 101495879 | 7/2009 |
| EP | 0 180 322 | 5/1989 |

(Continued)

OTHER PUBLICATIONS

Judd, et al.: "The Excitation of UHF Signals by Partial Discharges in GIS". IEEE Transactions on Dielectrics and Electrical Insulation. vol. 3 No. 2, Apr. 1996.

(Continued)

*Primary Examiner* — Jermele M Hollington (57) ABSTRACT

Several techniques are described herein for evaluating parameters relating to noise and excess current on a power line. More specifically, the techniques described herein are particularly well-suited for characterizing partial discharge, and for identifying a location of a source of the noise or the excess current on the power line.

8 Claims, 8 Drawing Sheets

(56) References Cited

U.S. PATENT DOCUMENTS

| | | |
|---|---|---|
| 2007/0139056 A1 | 6/2007 | Kaneiwa et al. |
| 2008/0048710 A1* | 2/2008 | Cern .................. G01R 31/1272 324/536 |
| 2009/0119035 A1 | 5/2009 | Younsi et al. |
| 2009/0189594 A1 | 7/2009 | Cern |
| 2015/0160284 A1* | 6/2015 | Cern .................. G01R 31/1272 324/536 |

FOREIGN PATENT DOCUMENTS

| | | |
|---|---|---|
| EP | 0 488 719 B1 | 1/1998 |
| EP | 1 094 324 B1 | 5/2005 |
| JP | H05157796 | 6/1993 |
| JP | 06-331690 | 12/1994 |
| JP | H08105928 | 4/1996 |
| JP | H095386 | 1/1997 |
| JP | 2003255012 | 9/2003 |
| JP | 2007-232623 A | 9/2007 |
| WO | WO 2010/023570 A1 | 3/2010 |

OTHER PUBLICATIONS

Cavallini, et al.: "A Novel Method to Locate PD in Polymeric Cable Systems Based on Amplitude-frequency (AF) Map". IEEE Transactions on Dielectrics and Electrical Insulation. vol. 14, No. 3; Jun. 2007.

Contin, et al.: "Classification and Separation of Partial Discharge Signals by Means of their Auto-correlation Function Evaluation". IEEE Transactions on Dielectrics and Electrical Insulation. vol. 16, No. 6; Dec. 2009.

Chinese Office Action dated Apr. 25, 2014 corresponding to Chinese Application No. 201180012549.7; 5 pages.

Chinese Office Action dated May 10, 2014 corresponding to Chinese Application No. CN201180012529.7; 11 pages.

International Search Report dated May 6, 2011 corresponding to PCT Application No. PCT/US2011/027116.

Japanese Patent Office dated Oct. 28, 2014 corresponding to Japanese Patent Application No. 2012-557113; 7 pages.

\* cited by examiner

EVALUATING NOISE AND EXCESS CURRENT ON A POWER LINE

CLAIM OF PRIORITY

This application is a 371 of International Application No. PCT/US11/27116, filed Mar. 4, 2011, which claims the benefit of U.S. Provisional Application No. 61/310,933, filed Mar. 5, 2010. The disclosures of these documents are hereby incorporated herein by reference for all purposes.

COPYRIGHT NOTICE

A portion of the disclosure of this patent document contains material which is subject to copyright protection. The copyright owner has no objection to the reproduction by anyone of the patent document or the patent disclosure, but otherwise reserves all copyright rights whatsoever.

BACKGROUND OF THE INVENTION

1. Field of the Invention

The present disclosure relates to power lines for distribution of electrical power, and more particularly, to an evaluation of noise and excess current on the power lines, for the sake of identifying a location of a source of the noise or excess current.

2. Description of the Related Art

The approaches described in this section are approaches that could be pursued, but not necessarily approaches that have been previously conceived or pursued. Therefore, unless otherwise indicated, the approaches described in this section may not be prior art to the claims in this application and are not admitted to be prior art by inclusion in this section.

Partial discharge (PD) is a phenomenon that occurs in insulation of an electrical power cable that has sustained damage, such as through aging, physical damage, or exposure to excessively high electric fields. PD may afflict cables, connectors, surge arrestors, and other high voltage devices. Faulty overhead insulators may also allow for an occurrence of noise with frequency and phase characteristics similar to PD. PD generates short pulses having durations in the nanosecond range or shorter. PD pulses tend to occur at certain phases of an AC power voltage, and tend to be roughly synchronized with the power frequency or twice the power frequency. PD is a member of a class of noise known as line-synchronized noise or line-triggered noise. PD pulses have a continuous broadband spectrum that typically includes a range between one kilohertz and hundreds of megahertz.

U.S. Pat. No. 7,532,012 describes several techniques for capturing a PD pulse, and also describes several parameters for evaluating waveforms to distinguish between waveforms relating to line-frequency-synchronized phenomena, such as PD pulses, and external interference, termed "ingress", not having line frequency periodicity. For waveforms distinguished as deriving from PD, these parameters have the further utility of quantifying the intensity of that PD.

A deteriorating cable may also suffer from very brief high current pulses, as might be expected from an arc or other temporary short circuit that clears itself. It is desirable to identify the deteriorating cable, and more particularly, its specific location, before it fails completely.

The present document discloses several techniques for distinguishing and quantifying PD and excess current, and identifying a location of a source of the PD or excess current.

SUMMARY OF THE INVENTION

The present document discloses several techniques of evaluating parameters relating to noise and excess current on a power line. The techniques are particularly well-suited for characterizing partial discharge (PD), and for identifying a location of a source of the noise or excess current.

One of the techniques is a method that includes (a) measuring a highest amplitude of a first spectral component of a partial discharge pulse sensed on an electrical cable, (b) determining a phase of a power frequency signal on the electrical cable at which the highest amplitude of the first spectral component occurred, (c) measuring a highest amplitude of a second spectral component of the partial discharge pulse at the phase, and (d) determining a location on the electrical cable at which the partial discharge pulse occurred, based on a relationship between the highest amplitude of the first spectral component and the highest amplitude of the second spectral component.

Another one of the techniques includes (a) measuring peak amplitudes of spectral components of PD pulses sensed on an electrical cable over a plurality of phases of a cycle of a power signal on said electrical cable, (b) subtracting a background noise level from said peak amplitudes, thus yielding resultant amplitudes, and (c) summing said resultant amplitudes, thus yielding a PD sum that indicates a magnitude of PD activity on said electrical cable.

Another one of the techniques is a method that includes (a) measuring, at a first location on a power cable, a first magnitude of a first power current that exceeds a threshold, (b) measuring, at a second location on the power cable, a second magnitude of a second power current that does not exceed the threshold, and (c) determining a location of a fault on the power cable, based on a relationship between the first magnitude and the second magnitude.

The present document also discloses a system that performs the methods, and a storage medium that contains instructions that control a processor to perform the methods.

Additionally, there is provided a system that includes:
(i) a switch that when closed passes noise from a power line, and when opened does not pass the noise;
(ii) an amplifier downstream of the switch, that produces an amplified output;
(iii) a channel having:
  (a) a filter that passes a spectral component of the amplified output within a particular frequency band, thus yielding a filtered output; and
  (b) a detector that detects values of the filtered output at a plurality of times, thus yielding a series of values; and
(iv) a processor that:
  (a) determines a lowest value of the series of values while the switch is opened, thus obtaining a first baseline value;
  (b) determines a lowest value of the series of values while the switch is closed, thus obtaining a second baseline value; and
  (c) determines a difference between the second baseline value and the first baseline value, thus yielding an excess value that indicates an excess of power line noise above amplifier noise.

BRIEF DESCRIPTION OF THE DRAWINGS

A component or a feature that is common to more than one drawing is indicated with the same reference number in each of the drawings.

DESCRIPTION OF THE INVENTION

In a power line communication system, power frequency is typically in a range of 50-60 Hertz (Hz) and a data communications signal frequency is greater than about 1 megahertz (MHz), and typically in a range of 1 MHz-50 MHz. A data coupler for power line communications couples the data communications signal between a power line and a communication device such as a modem.

An example of such a data coupler is an inductive coupler that includes a core, and a winding wound around a portion of the core. The core is fabricated of a magnetic material and includes an aperture. The inductive coupler operates as a transformer, and is situated on a power line such that the power line is routed through the aperture and serves as a primary winding of the transformer, and the winding of the inductive coupler serves as a secondary winding of the transformer. The data communications signal is coupled between the power line and the secondary winding via the core. The secondary winding is coupled, in turn, to the communication device.

A further use for an inductive coupler is to place the inductive coupler around a phase conductor or a neutral conductor, and sense high frequency energy generated by partial discharge (PD). The synergy achieved by a combination of functions, including a continuous sensing of the cable and insulator condition, and data communications, is particularly advantageous.

Capacitive couplers may also be used for PD sensing and for communications. However, high voltage capacitors are themselves vulnerable to the development of internal PD that may be difficult to distinguish from cable or insulation PD. Therefore, although capacitive couplers may be used for sensing PD, inductive couplers are better suited for this task.

Figure 1:
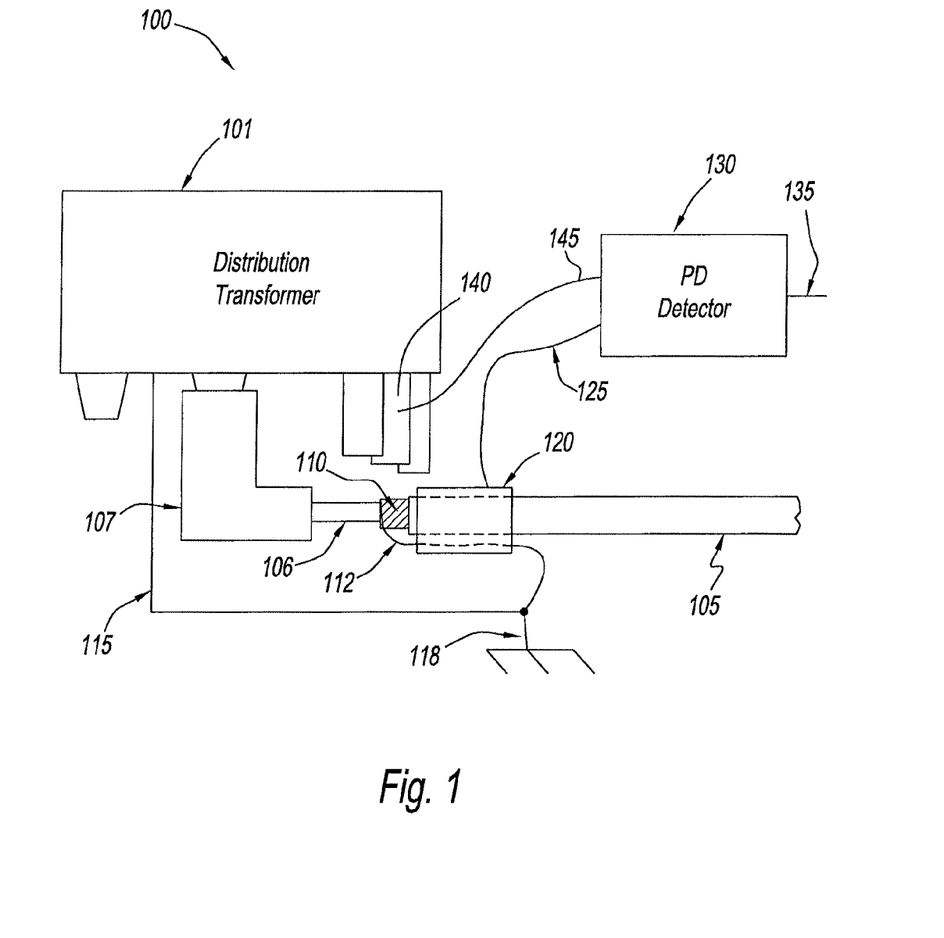
FIG. 1 is an illustration of a portion of a power distribution system configured with an arrangement of components to detect partial discharge (PD) on a cable in the power distribution system.

FIG. 1 is an illustration of a portion of a power distribution system 100 configured with an arrangement of components to detect PD on a cable in system 100. System 100 includes a medium voltage underground cable, i.e., a cable 105, a distribution transformer 101, a ground rod 118, an inductive coupler, i.e., a coupler 120, and a PD detector 130.

Coupler 120 includes a magnetic core (not shown) having an aperture (not shown) therethrough. Coupler 120 operates as a transformer, and is situated on cable 105 such that cable 105 is routed through the aperture and serves as a primary winding of coupler 120. Coupler 120 also includes a secondary winding having leads that run to PD detector 130 via a cable 125. Cable 105 has concentric neutral conductors 110 that are gathered together as a braid 112 and routed through the aperture to ground rod 118.

The routing of braid 112 through the aperture results in cancellation of neutral current induction into the coupler secondary. The net result is that coupler 120 senses current in a phase conductor of cable 105, including power frequency current and currents due to PD and ingress. The sensed current is available at the secondary winding of coupler 120, and thus also presented as a signal via cable 125.

As an alternative arrangement of coupler 120 on cable 105, or in a case where cable 105 does not include concentric neutral conductors 110, such as in a multi-phase power cable, coupler 120 may be placed directly on insulation 106 of the phase wire. In such a case, coupler 120 would preferably be packaged within a robust grounded conductive shield capable of routing fault current to ground, should the phase conductor's insulation fail. Alternatively, coupler 120 may be placed on braid 112.

Distribution transformer 101 is fed by cable 105, via an elbow connector 107. Distribution transformer 101 has a neutral conductor 115 connected to ground rod 118, and a secondary terminal 140. From secondary terminal 140, distribution transformer 101 provides a low voltage at power frequency. There is a substantially fixed phase relationship between the phase of a voltage (and current) on cable 105, and the phase of the low voltage on secondary terminal 140. The phase relationship may be slightly altered by load variations on distribution transformer 101.

PD detector 130 receives the sensed current from coupler 120 via cable 125, and receives the low voltage at power frequency from secondary terminal 140 via a cable 145. The low voltage at power frequency provides a phase reference for PD detector 130. PD detector 130 processes the sensed current from coupler 120 to detect PD in cable 105, and provides an output 135 that is connected to a communications link (not shown in FIG. 1), allowing an ongoing stream of PD monitoring data to reach a remote monitoring station (not shown in FIG. 1).

Coupler 120 also serves as a power line communications data coupler. That is, cable 125 is also routed to a communication device such as a modem (not shown in FIG. 1), and coupler 120 is employed to couple a data communication signal between cable 105 and the communication device.

Figure 2:
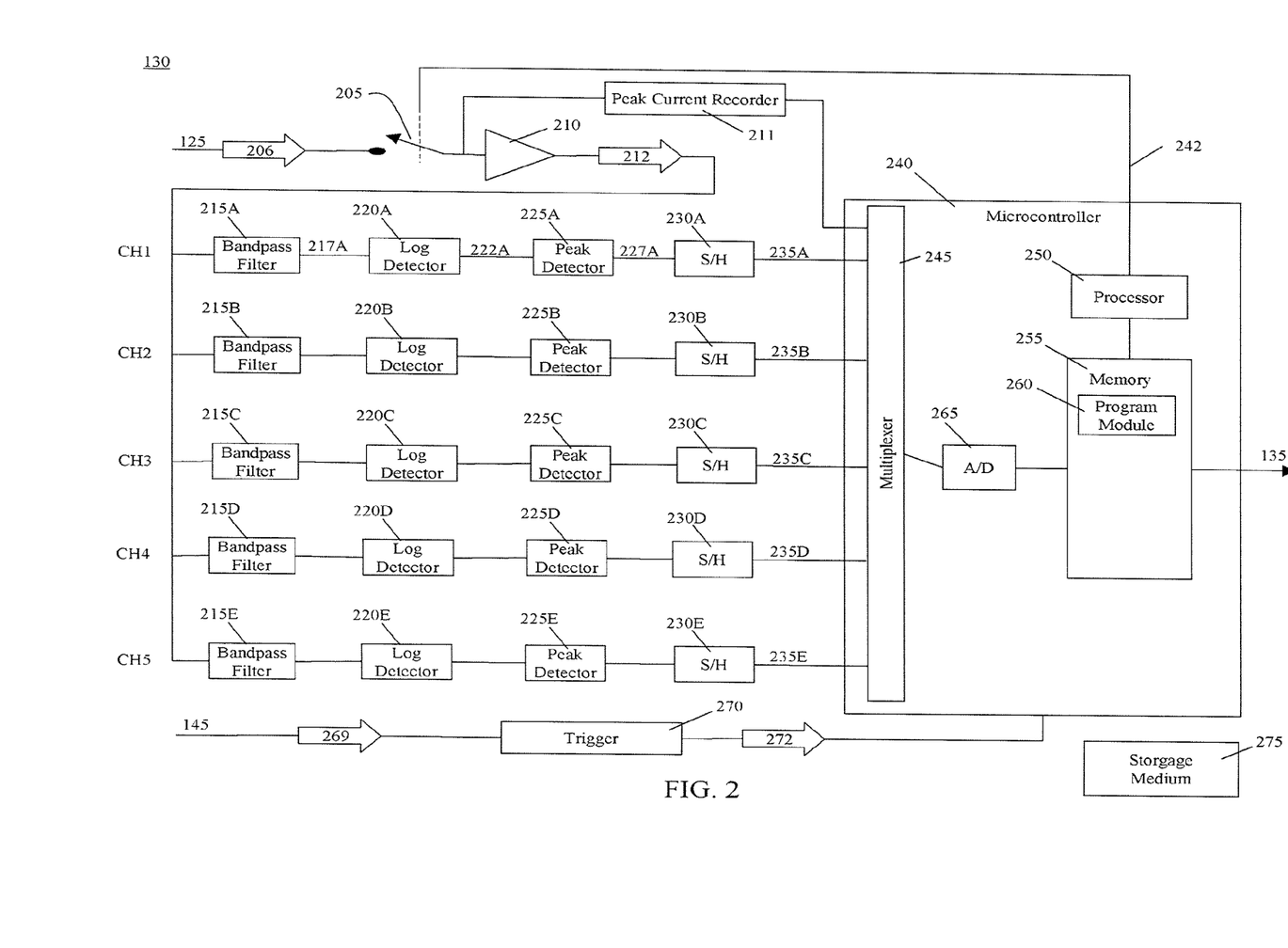
FIG. 2 is a block diagram of PD detector.

FIG. 2 is a block diagram of PD detector 130. PD detector 130 includes a switch 205, a peak current recorder 211, an amplifier 210, a microcontroller 240, a trigger circuit 270, and a group of components organized into five channels, namely channels CH1, CH2, CH3, CH4, and CH5. Microcontroller 240 includes a multiplexer 245, analog-to-digital converter (A/D) 265, a processor 250, and a memory 255.

Processor 250 is configured of logic circuitry that responds to and executes instructions.

Memory 255 is a computer-readable medium encoded with a computer program. In this regard, memory 255 stores data and instructions that are readable and executable by processor 250 for controlling the operation of processor 250. Memory 255 may be implemented in a random access memory (RAM), a hard drive, a read only memory (ROM), or a combination thereof. One of the components of memory 255 is a program module 260.

Program module 260 contains instructions that when read by processor 250, cause processor 250 to perform actions of methods employed by PD detector 130. The term "module" is used herein to denote a functional operation that may be embodied either as a stand-alone component or as an integrated configuration of a plurality of sub-ordinate components. Thus, program module 260 may be implemented as a single module or as a plurality of modules that operate in cooperation with one another. Moreover, although program module 260 is described herein as being installed in memory 255, and therefore being implemented in software, it could be implemented in any of hardware (e.g., electronic circuitry), firmware, software, or a combination thereof.

While program module 260 is indicated as already loaded into memory 255, it may be configured on a storage medium 275 for subsequent loading into memory 255. Storage medium 275 is also a computer-readable medium encoded with a computer program, and can be any conventional non-transitory storage medium that stores program module 260 thereon in tangible form. Storage medium 275 may be implemented in media such as a floppy disk, a compact disk, a magnetic tape, a read only memory, an optical storage media, universal serial bus (USB) flash drive, a digital versatile disc, or a zip drive. Alternatively, storage medium 275 can be implemented in a random access memory, or other type of electronic storage device, located on a remote storage system (not shown) and coupled to memory 255 via a network (not shown).

CH1 is configured of a bandpass filter 215A, a logarithmic (log) detector 220A, a peak detector 225A, and a sample and hold (S/H) 230A. Each of channels CH2 through CH5 is configured similarly to channel CH1, with bandpass filters 215B-215E, log detectors 220B-220E, peak detectors 225B-225E, and S/Hs 230B-230E. In a preferred implementation, bandpass filters 215A-E are surface acoustic wave (SAW) filters.

Switch 205 is shown in its open position, but when closed, couples a signal 206 from cable 125 (see FIG. 1) to amplifier 210. Signal 206 includes power frequency current and currents due to PD and ingress, sensed via coupler 120. Amplifier 210 amplifies signal 206, and outputs signal 212. Thus, signal 212 is an amplified version of signal 206. Signal 212 is routed to each of channels CH1 through CH5.

Each bandpass filter 215A-215E is tuned to a different center frequency and has a wide bandwidth (e.g. 1 MHz). Thus, each channel CH1 through CH5 "listens" to signals from coupler 120 on different frequency bands. One or more bandpass filters (e.g., 215A) have low center frequencies for which cable 105 does not appreciably attenuate PD, while other bandpass filters (e.g., 215E) have high center frequencies for which attenuation per unit distance is significant. Frequency bands of bandpass filters 215A-215E are preferably chosen to avoid frequencies of known sources of ingress, such as radio broadcasts.

Consider channel CH1. Bandpass filter 215A receives signal 212, and passes frequencies of signal 212 that are within the passband of bandpass filter 215A, to yield signal 217A. Log detector 220A receives signal 217A and converts it to a logarithmic representation thereof, designated as signal 222A. Peak detector 225A receives signal 222A, and detects its peak value to yield signal 227A. S/H 230A samples and holds the peak value of signal 227A, to yield signal 235A.

A PD source may be in close proximity to PD detector 130 and produce a strong signal, or the PD source may be distant from coupler 120 and produce a weak PD signal and be greatly attenuated as it propagates along cable 105. Thus, the PD signals may have magnitudes that span a broad dynamic range. Accordingly, signals 206, 212 and 217A may also cover a broad dynamic range. Log detector 220A can handle signal 217A having a broad dynamic range. Notwithstanding, the parameters described herein may also be calculated from a linear rather than logarithmic representation of amplitudes or some other non-logarithmic function that provides amplitude compression, for computational convenience.

Channels CH2 through CH5 operate similarly to channel CH1, and yield signals 235B-235E, respectively.

Trigger circuit 270 receives, via cable 145, a low voltage at power frequency designated as a signal 269, and produces a power line synchronization signal 272. Alternatively, rather than receiving signal 269, trigger circuit 270 could receive signal 212, and extract a power frequency component from signal 212. Nevertheless, power line synchronization signal 272 appears as one pulse per cycle of power frequency, e.g., one pulse per 60 Hz cycle or one pulse per 50 Hz cycle.

Microcontroller 240 receives signals 235A-235E, and power line synchronization signal 272. Signals 235A-235E are input to multiplexer 245, and selectively routed from an output of multiplexer 245 to A/D 265. A/D 265 converts signals 235A-235E into digital signals that are routed to memory 255. The operation of multiplexer 245, and thus the selection and routing of signals 235A-235E, is described further below.

Microcontroller 240 controls switch 205 via a control line 242, and also controls S/Hs 235A-235E. Signals 235A-235E are analog signals. The purpose of S/Hs 235A-235E is to hold the analog values of signals 235A-235E steady for a short time so that signals 235A-235E can be routed through multiplexer 245, and converted into digital data by A/D 265 in an orderly manner.

Consider signal 235A. Data comprising an array of samples of signal 235A is digitized by A/D 265. For illustration, assume that the array comprises 90 values, each representing a 4-degree phase interval, for a total of one power frequency cycle of 360 degrees, i.e., 90 equals 360 degrees/4 degrees. In this case, each interval, termed a time bin, has a duration of 1/60/90 seconds, or 185.19 microseconds (μs) for a 60 Hz power frequency, or 222.22 μs for a 50 Hz power frequency. This timing is derived from power line synchronization signal 272 by a timer (not shown) in microcontroller 240. The first in the array of samples of signal 235A is triggered by a logic transition in signal 272 that occurs after a positive-going zero-crossing of signal 269, i.e., the low voltage at power frequency. Each such data sample is proportional to the logarithm of the peak value of the amplitude of signal 217A, i.e., the output of bandpass filter 215A, within each time bin. The 90 values are routed to memory 255. Thus, for a single power frequency cycle, microcontroller 240 acquires 90 values from channel CH1.

Microcontroller 240, and more particularly processor 250, in accordance with program module 260, controls S/Hs 230A-230E and multiplexer 245, acquires 90 values for each of channels CH1 through CH5, evaluates the values to characterize one of more PD pulses, and provides a result of the evaluation via output 135. Microcontroller 240 may acquire the values for a single power frequency cycle, or under certain circumstances, as described below, may acquire values for a plurality of power frequency cycles.

Figure 3:
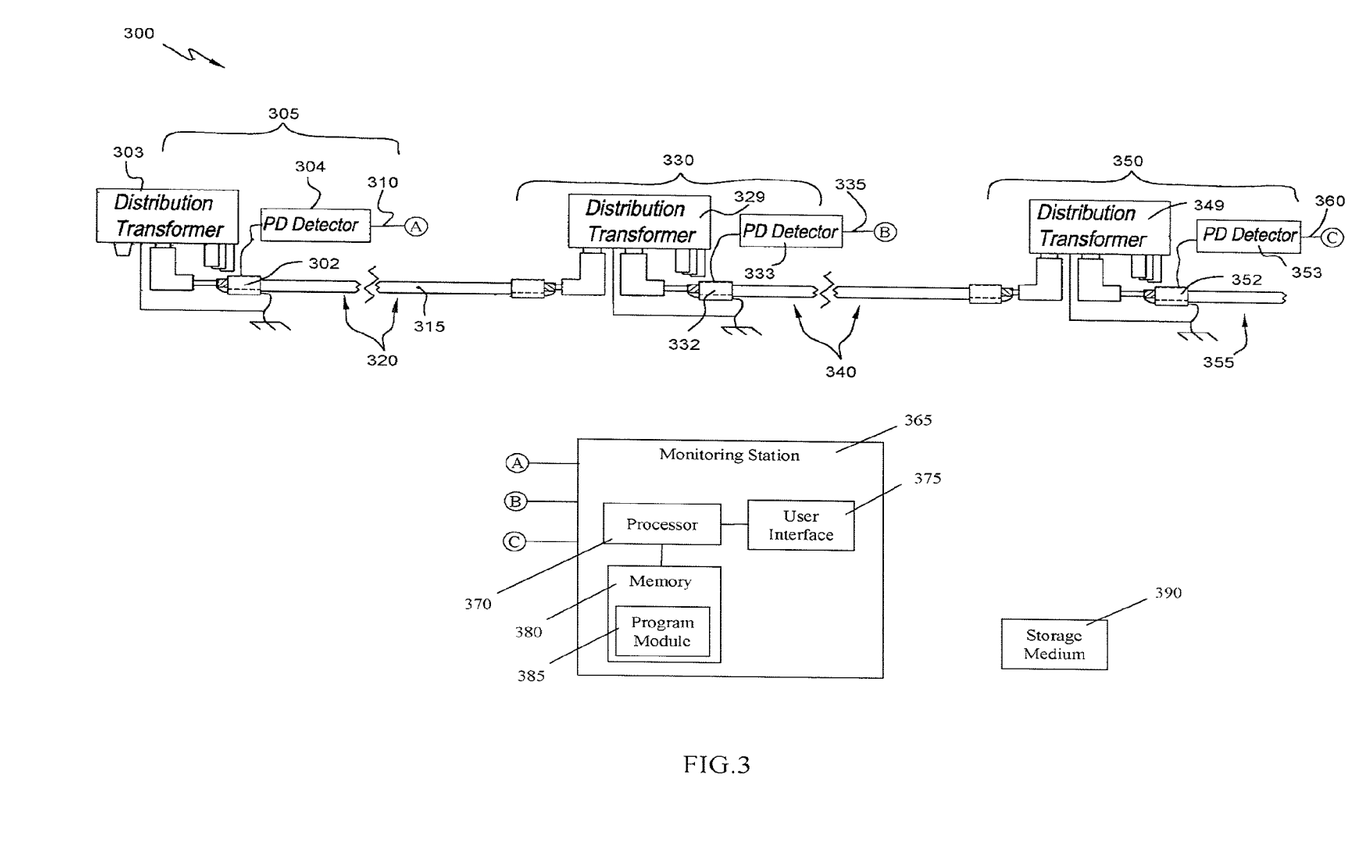
FIG. 3 is an illustration of a portion of a power distribution system that includes a network of couplers and PD detectors configured to detect PD at a plurality of locations within the power distribution system.

FIG. 3 is an illustration of a portion of a power distribution system, i.e., system 300, that includes a network of couplers and PD detectors configured to detect PD at a plurality of locations within system 300. System 300 includes distribution transformers 303, 329 and 349, power cables 320, 340 and 355, couplers 302, 332 and 352, and PD detectors 304, 333 and 353. Distribution transformer 303, coupler 302 and PD detector 304 are arranged at a location 305. Distribution transformer 329, coupler 332, and PD detector 333 are arranged at a location 330. Distribution transformer 349, coupler 352 and PD detector 353 are arranged at a location 350. System 300 also includes a monitoring station 365.

Primaries of distribution transformers 303, 329 and 349 are fed by cables 320, 340 and 355 arranged in a string, with power being supplied from cable 355. Distribution transformer 329 receives power from power cable 340, and passes power downstream via power cable 320.

Each of PD detectors 304, 333 and 353 operates similarly to PD detector 130, as described above, and provides results via outputs 310, 335 and 360, respectively.

Coupler 332 may be connected to a communications node (not shown) configured as a repeater. Such a node may incorporate PD detector 333. Similarly, coupler 302 may be connected to a communications node that may incorporate PD detector 304, and coupler 352 may be connected to a communications node that may incorporate PD detector 353.

Monitoring station 365 includes a processor 370, a user interface 375, and a memory 380. Processor 370 is configured of logic circuitry that responds to and executes instructions. Memory 380 includes instructions, in a program module 385, that are readable by processor 370 and that when read by processor 370, cause processor 370 to perform actions of methods employed by monitoring station 365. While program module 385 is indicated as already loaded into memory 380, it may be configured on a storage medium 390 for subsequent loading into memory 380. Memory 380 may be implemented in any of the embodiments described for memory 255, and storage medium 390 may be implemented in any of the embodiments described for storage medium 275.

User interface 375 includes an input device, such as a keyboard or speech recognition subsystem, for enabling a user to communicate information and command selections to processor 370. User interface 375 also includes an output device such as a display or a printer. A cursor control such as a mouse, track-ball, or joy stick, allows the user to manipulate a cursor on the display for communicating additional information and command selections to processor 370.

In system 300, since PD detectors 304, 333 and 353 are each at a different location 305, 330 or 350, system 300 obtains an indication of a power line condition detected at each of locations 305, 330 and 350. Monitoring station 365 receives outputs 310, 335 and 360 (in FIG. 3, coupled via connecting bubbles A, B and C), and based thereon, determines whether a cable or device is damaged. Via user interface 375, monitoring station 365 provides a report that indicates the urgency of a site visit, for a repair or for pre-emptive maintenance.

Unrelated to PD, a deteriorating cable may also suffer from transient high current pulses, e.g., in the range of about 1 millisecond to about 500 milliseconds, as might be expected from an arc or other temporary short circuit that clears itself. Referring again to FIG. 2, such pulses may be measured by peak current recorder 211 (shown in greater detail in FIG. 9). Peak current recorder 211 receives a voltage from coupler 120, via cable 125 that is proportional to the current flowing in the phase conductor of cable 105. Peak current recorder 211 measures the highest instantaneous current flowing in cable 105, and provides it as an input to multiplexer 245. Peak current recorder 211 is used during a peak current measurement, which is described later, below, in the present document.

Below, we consider several parameters for evaluation of PD.

Noise Floor Parameter

Refer again to FIGS. 1 and 2.

Passband frequencies of bandpass filters 215A-215E should preferably be selected to avoid active communications and broadcast bands, i.e., notable sources of ingress. Nevertheless, transmitters may be active at frequencies in the filter skirts, e.g., in the skirt of bandpass filter 215A, where filter attenuation may be insufficient to reduce ingress amplitude to a negligible value.

Recordings of data may be conducted over a single cycle of the power frequency or over a plurality of cycles of the power frequency, where the cycles are not necessary consecutive. The recording over a single cycle is designated herein as "Single Cycle Mode". The recording over a plurality of cycles, e.g., 5 cycles, may be processed as "max hold", similarly to a "max hold" employed on a spectrum analyzer, and so, the recording over a plurality of cycles is designated herein as "Max Hold Mode". In "Max Hold Mode", for each time-bin, the highest amplitude for that time-bin is retained among the samples recorded in the plurality of sweeps or cycles.

One technique for distinguishing between line-frequency-synchronized PD and other signals includes measuring the internal noise floor at the output of each channel. For example, the internal noise floor of CH1 is indicative of internal noise generated by amplifier 210 that falls within the passband of bandpass filter 215A. Such a measurement is made with switch 205 in its open position, as shown in FIG. 2.

Processor 250 controls PD detector 130 and evaluates the noise floor in accordance with instructions in program module 260.

Figure 4:
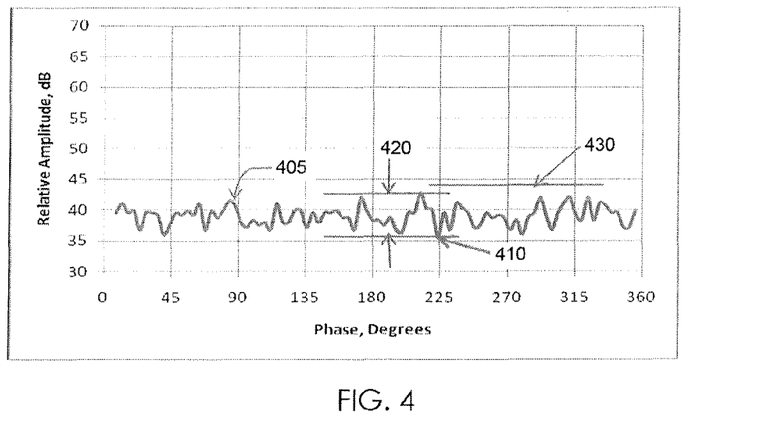
FIG. 4 is a graph of background noise of a single cycle of a power frequency signal for a single channel of a PD detector.

FIG. 4 is a graph of internal background noise, i.e., noise 405, of a single cycle of a power frequency signal for a single channel, i.e., channel CH1, of PD detector 130. Noise 405 represents internal noise of channel CH1, i.e., where switch 205 is open. The phase axis, i.e., x-axis, represents phase of the power frequency, where the 0-360 degree range represents a single cycle, e.g., 16.6 milliseconds (ms), of a 60 Hz power frequency. Zero degrees represents the positive-going zero crossing phase of a power voltage. The graph in FIG. 4 represents 90 discrete data values, however, for clarity, a line is drawn, connecting the 90 data values.

The bottom of a channel's noise floor, termed baseline 410, is defined as the lowest value among the 90 samples. In FIG. 4, baseline 410 is at 36 dB, the 0 dB reference being a fixed power level determined by the system gain and detector characteristics. As absolute signal levels are not utilized in the analysis, all signal levels are specified in dB above a fixed reference level.

Even with no coupler connected, i.e., with switch 205 open, each channel's instantaneous output, e.g., signal 235A, fluctuates above the lowest baseline 410 value. The amplitude of this fluctuation is primarily dependent on the channel's internal noise and its filter's bandwidth. For example, in FIG. 4, noise 405 fluctuates from a low of 36 dB to a high of 43 dB. This fluctuation is designated as a noise fluctuation 420, and has a value of 7 dB, i.e., 7 dB equals 43 dB minus 36 dB. A threshold 430 is defined at a level that internal background noise is never expected to exceed. In FIG. 4, threshold 430 is at 44 dB, which is slightly above the sum of baseline 410 and noise fluctuation 420.

In a method described below, the noise floor is measured with switch 205 open, and also measured with switch 205 closed. The measurement performed with switch 205 open is designated as an "initial baseline 410", and the measurement performed with switch 205 closed is designated as a "present baseline 410".

In a preferred implementation, a log detector is an envelope detector, and its 0 dB reference level is set below background noise levels, in which case its output is unipolar, e.g., always positive. As such, the output of log detector 220A is greater than or equal to zero, and so, signal 235A is also greater than or equal to zero. Therefore, when measuring the noise floor with switch 205 closed, if a PD pulse is present, the PD pulse would further increase the amplitude of signal 235A, in a positive direction, but only for a single time bin. In a majority of PD pulses, the time bin of their occurrence is different than the time bin of the occurrence of the lowest value 410 of the background noise. As such, a measurement of baseline 410 taken with switch 205 closed should have approximately the same low value, with or without the presence of PD pulses.

PD pulses are typically absent over certain phase intervals of power frequency phase. On the other hand, signals unsynchronized with the power line will often have a carrier wave that is continuous, and thus raise baseline 410. By periodically monitoring the value of baseline 410, to obtain a present baseline 410, and comparing it to the initial baseline 410 that was measured with switch 205 opened, microcontroller 240 can evaluate whether the signals on a particular channel include substantial ingress, both at a time of installation of PD detector 130, and during subsequent monitoring periods.

Baseline 410 may be different for each of channels CH1 through CH5, and for a single channel may be different for Single Cycle Mode versus Max Hold Mode. Max Hold Mode is more sensitive to ingress not synchronized with power line frequency, particularly if such ingress is pulsating rather than continuous.

An initial baseline 410 is measured with switch 205 opened, and a present baseline 410 is measured with switch 205 closed, for each of channels CH1 through CH5.

For a given channel, if present baseline 410 is higher than initial baseline 410, then it means that the channel has some level of ingress. If present baseline 410 is significantly higher than initial baseline 410, e.g., by 5 dB, then the channel is being subjected to substantial ingress, and may be regarded as being desensitized to detecting PD. Thus, to compensate for this higher baseline 410, the increase may be added to the amplitude of pulses protruding above baseline 410. When the increase is much larger, e.g. 10 dB, a channel may be disqualified for detecting PD.

Thus, processor 250 evaluates baseline 410 during production testing of PD detector 130, and PD detector 130's internal noise level is noted. In field deployment of PD detector 130, processor 250 evaluates baseline 410 to detect ingress on a particular channel, and to remove that channel from participation in PD quantification or localization if there is substantial ingress.

There is thus provided a system that includes:
(i) a switch that when closed passes noise from a power line, and when opened does not pass the noise;
(ii) an amplifier downstream of the switch, that produces an amplified output;
(iii) a channel having:
  (a) a filter that passes a spectral component of the amplified output within a particular frequency band, thus yielding a filtered output; and
  (b) a detector that detects values of the filtered output at a plurality of times, thus yielding a series of values; and
(iv) a processor that:
  (a) determines a lowest value of the series of values while the switch is opened, thus obtaining a first baseline value;
  (b) determines a lowest value of the series of values while the switch is closed, thus obtaining a second baseline value; and
  (c) determines a difference between the second baseline value and the first baseline value, thus yielding an excess value that indicates an excess of power line noise above amplifier noise.

Highest Peak Amplitude

Figure 5A:
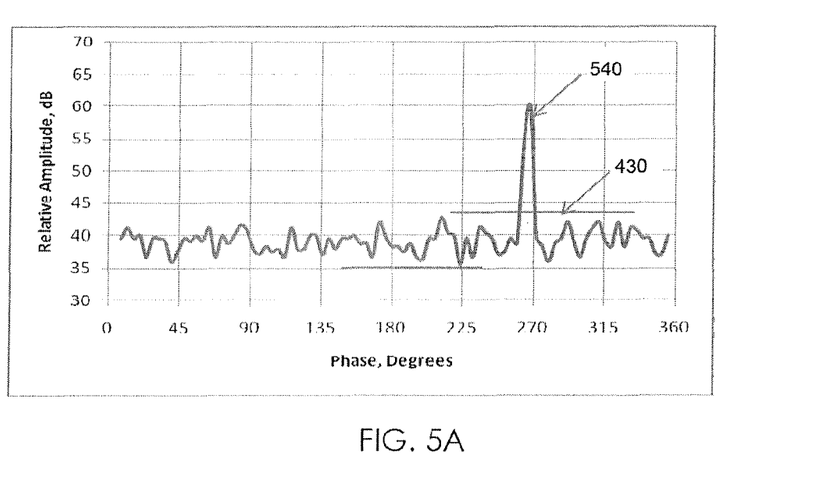
FIG. 5A is a graph of signal at an output of a channel of a PD detector, where the signal includes a single PD pulse.

FIG. 5A is a graph of signal at an output of a channel, where the signal includes a single PD pulse, i.e., a PD pulse 540.

Figure 5B:
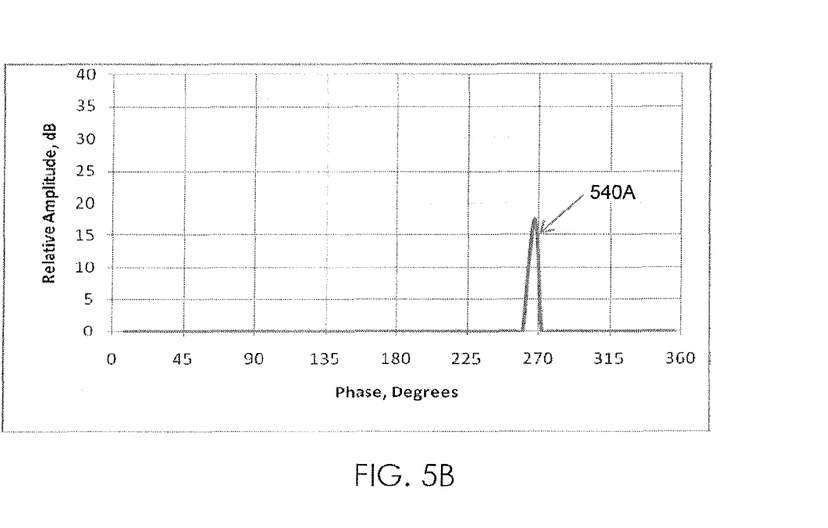
FIG. 5B is graph of the same signal as in FIG. 5A, for data points that exceed a threshold.

FIG. 5B is graph of the same signal as in FIG. 5A, for data points that exceed threshold 430. FIG. 5B is derived from FIG. 5A. Starting with FIG. 5A, threshold 430, i.e., 44 dB, is subtracted from all data points, and negative results are set to zero. Then, PD pulse 540A appears above a flat floor, as shown in FIG. 5B.

Refer again to system 300, in FIG. 3. For a given PD detector, in a single power frequency cycle, none, one or multiple PD pulses may occur.

Consider PD detector 333, at location 330. Assume that one of its channels is designated as channel M, and other of its channels is designated as channel N. Channels M and N have different center frequencies. Also consider that an individual PD pulse that occurs somewhere in system 300 may include some spectral energy that falls within the bandpass of channel M, and some spectral energy that falls within the bandpass of channel N.

Figure 6A:
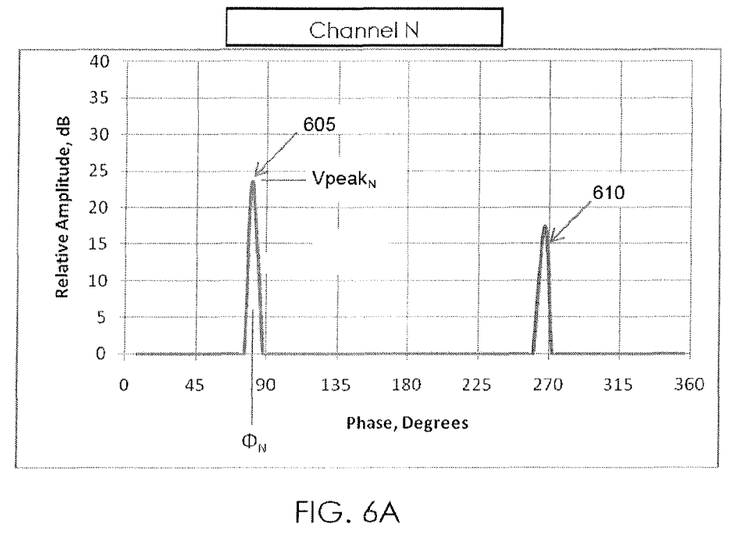
FIG. 6A is a graph of a recording of two PD pulses that are captured in a channel of a PD detector.

FIG. 6A is a graph of a recording of two PD pulses that are captured in channel N of PD detector 333. The two pulses are designated as PD pulse 605 and PD pulse 610, respectively. PD pulse 605 occurs at a phase of about 80 degrees, and PD pulse 610 occurs at a phase of about 265 degrees.

Figure 6B:
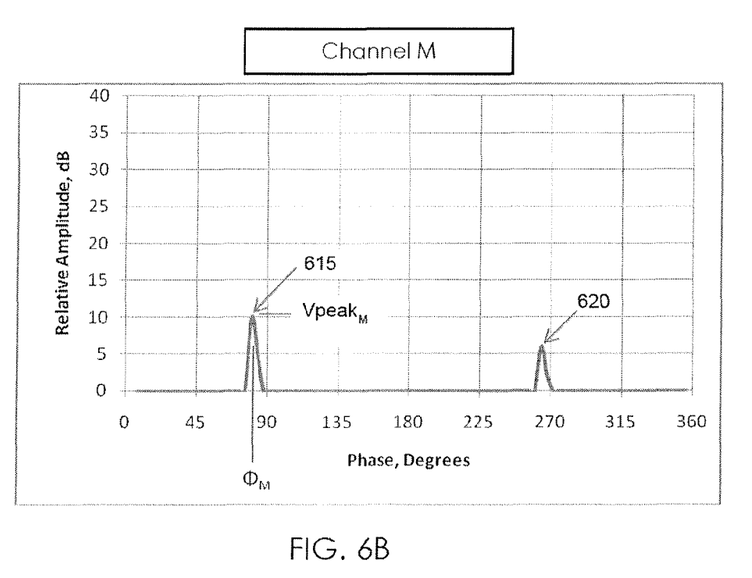
FIG. 6B is a recording of the same two PD pulses as in FIG. 6A, captured in another channel of the PD detector.

FIG. 6B is a recording of the same two PD pulses as in FIG. 6A, that is, one at about 80 degrees and one at about 265 degrees, captured in channel M of PD detector 330. In FIG. 6B, the two pulses are designated as PD pulse 615 and PD pulse 620.

To be clear, each of the two PD pulses is captured in channel N and channel M. The first of the two PD pulses, occurring at about 80 degrees, is captured in channel N as PD pulse 605, and also captured in channel M as PD pulse 615. The second of the two pulses, occurring at about 265 degrees, is captured in channel N as PD pulse 610, and captured in channel M as PD pulse 620.

In channel N, i.e., FIG. 6A, PD pulse 605 has a greater amplitude than does PD pulse 610. In this case, PD pulse 605 has the highest amplitude, i.e., 24 dB, which is designated as Vpeak$_N$, and is recorded. The phase, i.e., 80 degrees, of this highest amplitude sample, is designated as $\Phi_N$, and also recorded. Thus, the peak PD pulse for channel N is designated by a data pair ($\Phi_N$, Vpeak$_N$). This same PD pulse is also the highest amplitude sample in channel M (see FIG. 6B). More specifically, PD pulse 615 has an amplitude of 10 dB, and is designated by a data pair ($\Phi_M$, Vpeak$_M$). $\Phi_M$ being equal to $\Phi_N$ indicates that the two channels, M and N, recorded the same PD pulse in their respective frequency bands.

Consider now PD detector 304, at location 305, and PD detector 353, at location 350. Each of the three PD detectors 304, 333 and 353 includes channels M and N, and records highest peaks at the same phase, i.e., 80 degrees. By way of example, let us assume that the center frequency of channel M is greater than that of channel N, and that their highest peaks values are as presented in Table 1.

TABLE 1

Amplitude of PDM Highest Peak above Background Noise Level, dB

|  | PD detector 304 at location 305 | PD detector 333 at location 330 | PD detector 353 at location 350 |
|---|---|---|---|
| Channel N (lower frequency) | 20 dB | 24 dB (see FIG. 6A) | 21 dB |
| Channel M (higher frequency) | 5 dB | 10 dB (see FIG. 6B) | 7 dB |

Data from each of PD detectors 304, 333 and 353 is communicated to monitoring station 365, and the data in Table 1 is processed there.

Where a PD source in system 300 produces a PD pulse, the PD pulse's highest frequency components may be so attenuated that fewer than all of PD detectors 304, 333 and 353 detect the PD pulse. So, a first approximation of the location of the PD source that can be performed at monitoring station 365 is (a) determining the highest frequency channel for which PD exists for a group of neighboring PD detectors; in this case the group consists of PD detectors 304, 333 and 353, and channel M is the channel with the highest frequency, (b) obtaining the highest peak value from that highest frequency channel; in the present case channel M has values 5 dB, 10 dB and 7 dB, and (c) selecting the PD detector with the highest of these values as the PD detector closest to the PD source, in the present case, PD detector 333, at location 330, has the highest value, i.e., 10 dB. Thus, the PD source is most likely in the vicinity of location 330.

There is thus provided a method that includes (a) measuring a highest amplitude of a first spectral component of a partial discharge pulse sensed on an electrical cable, (b) determining a phase of a power frequency signal on the electrical cable at which the highest amplitude of the first spectral component occurred, (c) measuring a highest amplitude of a second spectral component of the partial discharge pulse at the phase, and (d) determining a location on the electrical cable at which the partial discharge pulse occurred, based on a relationship between the highest amplitude of the first spectral component and the highest amplitude of the second spectral component.

PD Sum

Complementing the highest peak amplitude parameter is a parameter indicative of the severity of PD discharge, designated herein as "PD Sum", and defined as a sum of amplitude values that exceed threshold 430 sampled in a single cycle for a single channel, e.g., see FIG. 5B. In FIG. 6A, PD sum represents the sum of the area under PD pulse 605 and the area under PD pulse 610. PD sum increases with both the amplitude and duration of PD pulses.

Figure 7:
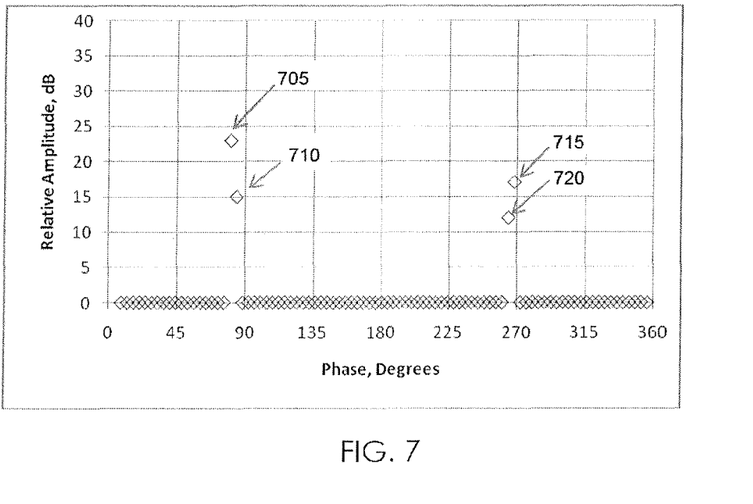
FIG. 7 is a graph of a sampled signal, where each sample represents an individual time-bin, e.g., 4 degrees of phase, in a single channel or a PD detector for a single cycle of power frequency.

FIG. 7 is a graph of a sampled signal, where each sample represents an individual time-bin, e.g., 4 degrees of phase, in a single channel of a PD detector for a single cycle of power frequency. For a first PD pulse, a sample 705 is acquired at a phase at 80 degrees, and a sample 710 is acquired at 84 degrees. Thus, the first PD pulse has a duration of greater than one time-bin. For a second PD pulse, a sample 720 is acquired at 264 degrees, and a sample 715 is acquired at 268 degrees. Thus, the second PD pulse also has a duration of greater than one time-bin. In FIG. 7, the PD Sum equals the sum of the amplitude values of samples 705, 710, 715 and 720.

PD for a given fault location typically generates zero, one or at most two discharges during a given cycle. However, on different cycles, the phase of PD pulses may vary by a few degrees, for example at 86 degrees in a first cycle, and at 90 degrees in a second cycle. A Max Hold Mode recording over a number of cycles captures multiple discharges that occurred at different phase angles.

PD Sum is a more sensitive indicator of PD when Max Hold Mode is used, compared to Single Cycle Mode. This is because, in Single Cycle Mode, only a signal cycle of power frequency is being considered, and if no PD occurs during that single cycle, no PD will be detected. However, even under intermittent PD conditions, where PD appears on some but not all of the cycles, by using Max Hold Mode, PD Sum will be non-zero.

As a PD source (e.g., a cable, connector, etc.) deteriorates, PD pulses will occur at a lower instantaneous voltage level, thus generating a distribution of discharges over a wider range of phases. Therefore, the PD Sum of a Max Hold Mode recording may begin as a small value for a cable that only discharges at the power voltage peaks (e.g., 90 degrees or 270 degrees), but grows in proportion to the phase-spread of the discharges, as the cable deteriorates. Thus a PD Sum of a Max Hold Mode recording is sensitive to both PD amplitude and phase spread.

During Max Hold Mode recording, PD Sum may vary from single digit values, e.g., an occasional single PD pulse, to several thousand, e.g., severe PD in every cycle. A convenient means of expressing PD Sum in a user-friendly range is with "PD Severity", which is defined herein as 20 log(PD Sum+1). PD Severity will typically range from zero to about 70, and be higher for Max Hold Mode than for Single Cycle Mode recording. PD Severity measured with Max Hold Mode can be compared to PD Severity measured with Single Cycle Mode, by subtracting a compensation factor from PD Severity measured with Max Hold Mode.

For example, a PD Severity measured in Max Hold Mode might be 35, while that same signal would be measured in Single Cycle Mode as 21. By subtracting 14 from the Max Hold measurement, the value of 21 is obtained, equal to that obtained in Single Cycle Mode.

There is thus provided a method that includes (a) measuring peak amplitudes of spectral components of partial discharge (PD) pulses sensed on an electrical cable over a plurality of phases of a cycle of a power signal on said electrical cable, (b) subtracting a background noise level from said peak amplitudes, thus yielding resultant amplitudes, and (c) summing said resultant amplitudes, thus yielding a PD sum that indicates a magnitude of PD activity on said electrical cable.

Max Hold—Single Cycle State Machine

As mentioned above, recordings of PD pulses can be performed in either of Single Cycle Mode or Max Hold Mode. For power cables and devices that have only begun to display PD, PD pulses may not occur on most cycles of a power frequency signal. Consequently, Single Cycle Mode may not detect any PD at all, especially if the PD is only active once every several minutes. Therefore, initially, it is advantageous to use Max Hold Mode, which detects the highest signal points over several cycles, e.g., 5 cycles.

As a PD source, e.g., power cable or device, deteriorates and PD becomes more prevalent, Max Hold Mode tends to display considerable overlap of discharges recorded on different cycles. That is, PD pulses typically occur at the same phase in each of a plurality of cycles, and therefore overlap, and so, PD Sum in Max Hold Mode does not increase. However, as the PD source further deteriorates, the phase spread of these discharges typically increases. For example, a PD pulses may initially occur at 90 degrees, and subsequently spread to encompass a range from 86 degrees to 94 degrees. As such, the multitude of high amplitude points tends to saturate the recording. In this case, a switch to Single Cycle Mode is desirable. Should PD later decrease, the PD detector would preferably revert to Max Hold Mode.

Thus, in a case of a low level of PD activity, PD Sum tends to be low, and Max Hold Mode is better suited to record the PD activity. In a case of a high level of PD activity, PD Sum tends to be high, and Single Cycle Mode is better suited to record the PD activity. Automatic shifting between Max Hold Mode and Single Cycle Mode both increases the dynamic range of the PD detector and allows waveform analysis of waves that are neither blank nor saturated.

A state machine can be employed to "shift gears" between the two recording modes at some threshold levels of PD Sum, where an amount of hysteresis is introduced to prevent excess shifting. To use a comparable scale for both modes, PD Sum measured with Max Hold Mode may be divided by a compensating factor.

Figure 8:
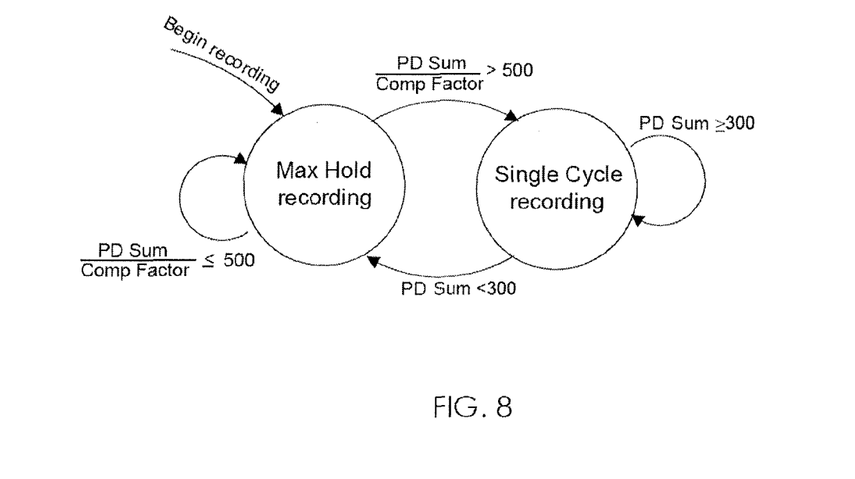
FIG. 8 is a state diagram of a state machine that controls switching between a Max Hold Mode and a Single Cycle Mode in PD detector.

FIG. 8 is a state diagram of a state machine that controls switching between Max Hold Mode and Single Cycle Mode in PD detector 130 (FIG. 2). The state machine can be implemented in microcontroller 240, for example, by processor 250 acting in accordance with instructions in program module 260.

Recording beings in Max Hold Mode. At the beginning of a Max Hold Mode recording, PD Sum is cleared to zero, and the recording is conducted for several power frequency cycles, e.g., 5 cycles. After the recording, PD Sum it calculated based on data that was acquired during the recording. If PD Sum divided by the compensating factor exceeds a value of 500, then PD detector 130 switches to Single Cycle Mode. If PD Sum divided by the compensating factor is less than or equal to 500, then PD detector 130 remains in Max Hold Mode.

In Single Cycle Mode, at the beginning of a recording, PD Sum is cleared to zero, and the recording is conducted for a single power frequency cycle. After the recording, PD Sum is calculated based on data that was acquired during the recording. If PD Sum is greater than or equal to 300, then PD detector 130 remains in Single Cycle Mode. If PD Sum is less than 300, then PD detector 130 switches to Max Hold Mode.

Raw Data Scale—Linear or Logarithmic

PD parameters defined above, namely baseline, noise fluctuation, highest peak amplitude, PD Sum and PD Severity are calculated for both Single Cycle Mode and Max Hold Mode. The value of each data sample (e.g., a sample of signal 235A) is proportional to the logarithm of an output (e.g., signal 217A) of a bandpass filter (e.g., bandpass filter 215A). Alternatively, these values could be directly proportional to the amplitude of the filter output (e.g., signal 217A).

Alarm Criteria (in Particular, Alarm Related to Rapid Changes)

Referring again to FIG. 3, the several parameters described above, namely baseline, noise fluctuation, highest peak amplitude, PD Sum and PD Severity, are communicated to monitoring station 365, for locating one or more faults on a feeder and for following the deterioration of cable and devices, with a view to scheduling routine maintenance, well in advance of a preventable failure. This process minimizes costly emergency service through prevention of outages and avoiding costly mass replacement of cables that might otherwise continue to provide reliable service for many years.

Sending line crews to repair or replace cables and devices has a substantial cost per sortie, and so, it is useful to define criteria for generating genuine alarms. Alarms may be used for focusing the attention of administrators on specific locations, in advance of an outage. One or more of the parameters described above may generate an alarm based on exceeding an absolute threshold, termed "Level Alarm" and independently, may generate an alarm based on exceeding an increment threshold, termed "Change Alarm."

At the installation phase of a PD detector, PD levels for the several channels are stored in memory. Well before an absolute threshold is reached, that is, well before a Level Alarm would be generated, a Change Alarm may be issued in response to a PD parameter increase on one or more channels, and a new PD level updates the value stored in memory. Change Alarms recurring at short intervals may be interpreted as indicating a rapidly deteriorating cable, and serve to draw the attention of administrators to a suspected location.

For example, if PD Severity for any of channels 1 through 5 of PD Detector 333 (FIG. 3) reached or exceeded a value of 40, a Level Alarm would be sent to monitoring station 365. Separately, should PD Severity increase by a significant amount (e.g. from a value of 23 to 33, i.e., an increase of 10) from a previously measured level, then a Change Alarm would be sent.

Peak Current Measurement

As mentioned above, a deteriorating cable may also suffer from very brief high current pulses, as might be expected from an arc or other temporary short circuit that clears itself, and such pulses may be measured by peak current recorder 211 (FIG. 2). Referring again to FIG. 3, each of PD detectors 304, 333 and 353 also includes a peak current recorder 211.

Taking advantage of the installation of inductive couplers 302, 332 and 352, PD detectors 304, 333 and 353, and a data communications infrastructure that connects PD detectors 304, 333 and 353 to monitoring station 365, e.g. via power line communications, wireless or other media, the level of power current pulses may be recorded by each PD detector 304, 333 and 353. Should the power current pulses exceed a level such as the cable's maximum current rating, an alarm can be sent by the respective microcontroller 240 (via its output 135) to monitoring station 365. Monitoring station 365 is in turn monitored, for example by a human, and alarms sent to monitoring station 365 are evaluated to decide whether to perform maintenance on the power cable.]

Consider the case of a cable short circuit causing an outage for all consumers fed by a power cable. Each PD detector's peak current detector would measure the cable's current at the PD detector's location. Locations upstream of the short circuit, i.e., between the cable's feed point and the PD detector, would measure very high fault currents, while PD detectors downstream would measure normal load currents, until some protective device, such as a fuse, disconnects the cable from its feed point. The pattern of measured currents along the cable indicates the approximate location of the short circuit. However, this information might be lost if the PD detector cannot relay the information before its own power is lost due to the fault.

In a preferred embodiment, each PD detector, e.g., PD detector 304, has its own backup power source such as a battery (not shown), which keeps PD detector 304 in operation for a period long enough to send an alarm to monitoring station 365. For the plurality of PD detectors 304, 333 and 353 deployed along a power line, the pattern of peak currents prior to an outage may indicate the location of a short circuit fault. For example, PD detectors between a power input location and a fault location will measure fault current, while PD detectors beyond the fault will only measure normal load current.

There is provided a method that includes (a) measuring, at a first location on a power cable, a first magnitude of a first power current that exceeds a threshold, (b) measuring, at a second location on the power cable, a second magnitude of a second power current that does not exceed the threshold, and (c) determining a location of a fault on the power cable, based on a relationship between the first magnitude and the second magnitude. The threshold may be set at a maximum current rating for the power cable. The first power current and the second power current may be of a continuous duration, or they may be transient power currents with durations in a range of about 1 millisecond to about 500 milliseconds. Processor 370 performs the method in accordance with program module 385.

Figure 9:
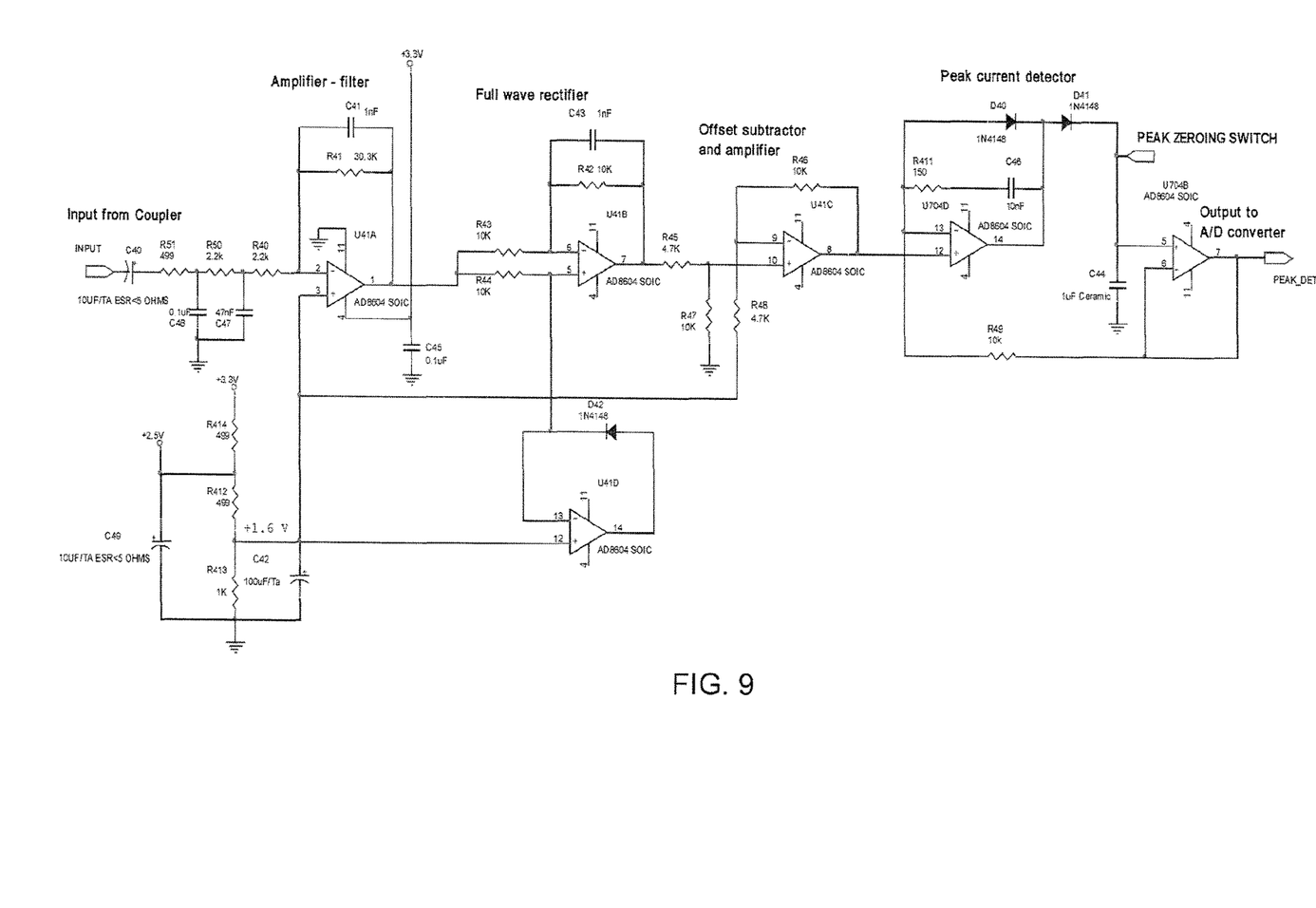
FIG. 9 is a schematic of a peak current recorder.

FIG. 9 is a schematic of peak current recorder 211 (See FIG. 2). Peak current recorder 211 includes an amplifier and a low pass filter, i.e., amplifier-filter 905, to reject ingress and PD, a full wave rectifier 910 to be equally sensitive to current peaks of either polarity, an amplifier 915 for scaling the signal to an A/D converter's input range, and a peak detector 920. Peak detector 920 has a capacitor C44 that acts as an analog memory, and stores the highest value recorded since the last time this value was transferred to digital data memory.

In normal operation, the peak current value will equal the root-mean-square (rms) value of feeder current multiplied by the crest factor, equal to the square root of two for a sinusoidal waveform. For a typical cable rated for 200 amperes rms, a normal peak current value could reach 282 amperes. Any value exceeding that value would justify an alarm to monitoring station 365.

The techniques described herein are exemplary, and should not be construed as implying any particular limitation on the present disclosure. It should be understood that various alternatives, combinations and modifications could be devised by those skilled in the art. For example, steps associated with the processes described herein can be performed in any order, unless otherwise specified or dictated by the steps themselves. The present disclosure is intended to embrace all such alternatives, modifications and variances that fall within the scope of the appended claims.

The terms "comprises" or "comprising" are to be interpreted as specifying the presence of the stated features, integers, steps or components, but not precluding the presence of one or more other features, integers, steps or components or groups thereof.

What is claimed is:

1. A method comprising:
measuring peak amplitudes of spectral components of partial discharge (PD) pulses sensed on an electrical cable over a plurality of phases of a cycle of a power signal on said electrical cable;
subtracting a background noise level from said peak amplitudes, thus yielding resultant amplitudes;
summing said resultant amplitudes, thus yielding a first PD sum that indicates a magnitude of PD activity on said electrical cable at a first time;
repeating said measuring, subtracting and summing after a passage of time, thus yielding a second PD sum at a second time; and,
issuing an alarm if a difference between said second PD sum and said first PD sum is greater than a threshold value.

2. A method comprising:
measuring, at a first location on a power cable, a first magnitude of a first power current that exceeds a threshold;
measuring, at a second location on said power cable, a second magnitude of a second power current that does not exceed said threshold;
determining a location of a fault on said power cable, based on a relationship between said first magnitude and said second magnitude, and,
wherein said first power current and said second power current are transient power currents with durations in a range of about 1 millisecond to about 500 milliseconds.

3. A system comprising:
a switch that when closed passes noise from a power line, and when opened does not pass said noise;
an amplifier downstream of said switch, that produces an amplified output;
a channel having:
   a filter that passes a spectral component of said amplified output within a particular frequency band, thus yielding a filtered output; and
   a detector that detects values of said filtered output at a plurality of times, thus yielding a series of values; and
a processor that:
(a) determines a lowest value of said series of values while said switch is opened, thus obtaining a first baseline value;
(b) determines a lowest value of said series of values while said switch is closed, thus obtaining a second baseline value; and
(c) determines a difference between said second baseline value and said first baseline value, thus yielding an excess value that indicates an excess of power line noise above amplifier noise.

4. The system of claim 3, wherein said processor also:
(d) disqualifies said channel as a partial discharge detector if said excess value exceeds a predetermined threshold.

5. A system comprising:
a processor; and
a memory that stores instructions that are readable by said processor, and when read by said processor, cause said processor to:
measure peak amplitudes of spectral components of partial discharge (PD) pulses sensed on an electrical cable over a plurality of phases of a cycle of a power signal on said electrical cable;
subtract a background noise level from said peak amplitudes, thus yielding resultant amplitudes;
sum said resultant amplitudes, thus yielding a first PD sum that indicates a magnitude of PD activity on said electrical cable at a first time;

repeat said measurement, subtraction and summation after a passage of time, thus yielding a second PD sum at a second time; and, issue an alarm if said second PD sum is greater than said first PD sum by more than a threshold value.

6. A system comprising:

a processor; and a memory that stores instructions that are readable by said processor, and when read by said processor, cause said processor to perform actions of:

measuring, at a first location on a power cable, a first magnitude of a first power current that exceeds a threshold;

measuring, at a second location on said power cable, a second magnitude of a second power current that does not exceed said threshold; and determining a location of a fault on said power cable, based on a relationship between said first magnitude and said second magnitude, and wherein said first power current and said second power current are transient power currents with durations in a range of about 1 millisecond to about 500 milliseconds.

7. A non-transitory storage medium that contains instructions that are readable by a processor, and when read by said processor, cause said processor to:

measure peak amplitudes of spectral components of partial discharge (PD) pulses sensed on an electrical cable over a plurality of phases of a cycle of a power signal on said electrical cable;

subtract a background noise level from said peak amplitudes, thus yielding resultant amplitudes;

sum said resultant amplitudes thus yielding a first PD sum that indicates a magnitude of PD activity on said electrical cable at a first time;

repeat said measurement, subtraction and summation after a passage of time, thus yielding a second PD sum at a second time; and, issue an alarm if said second PD sum is greater than said first PD sum by more than a threshold value.

8. A non-transitory storage medium that contains instructions that are readable by a processor, and when read by said processor, cause said processor to perform actions of:

measuring, at a first location on a power cable, a first magnitude of a first power current that exceeds a threshold;

measuring, at a second location on said power cable, a second magnitude of a second power current that does not exceed said threshold;

determining a location of a fault on said power cable, based on a relationship between said first magnitude and said second magnitude, and, wherein said first power current and said second power current are transient power currents with durations in a range of about 1 millisecond to about 500 milliseconds.

* * * * *